United States Patent
Choi et al.

(10) Patent No.: US 10,367,104 B2
(45) Date of Patent: Jul. 30, 2019

(54) SOLAR CELL

(71) Applicant: LG ELECTRONICS INC., Seoul (KR)

(72) Inventors: Jaewoo Choi, Seoul (KR); Chungyi Kim, Seoul (KR); Joohyun Koh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/858,798

(22) Filed: Dec. 29, 2017

(65) Prior Publication Data

US 2018/0204962 A1 Jul. 19, 2018

(30) Foreign Application Priority Data

Jan. 13, 2017 (KR) .................. 10-2017-0006173

(51) Int. Cl.
*H01L 31/044* (2014.01)
*H01L 31/0224* (2006.01)
*H01L 31/0216* (2014.01)
*H01L 31/18* (2006.01)

(52) U.S. Cl.
CPC ........... *H01L 31/022425* (2013.01); *H01L 31/02168* (2013.01); *H01L 31/1868* (2013.01); *Y02E 10/50* (2013.01); *Y02P 70/521* (2015.11)

(58) Field of Classification Search
CPC ............... H01L 31/00–078; Y02E 10/50–60
USPC .................................................. 136/243–265
See application file for complete search history.

(56) References Cited

U.S. PATENT DOCUMENTS

| | | |
|---|---|---|
| 3,765,935 A | 10/1973 | Rand et al. |
| 2010/0243029 A1* | 9/2010 | Higashi ............ H01L 31/048 136/244 |
| 2011/0094575 A1* | 4/2011 | Phan ............ H01L 31/02167 136/256 |
| 2012/0061247 A1* | 3/2012 | Ahmed ............ C25D 3/54 205/170 |
| 2012/0222741 A1* | 9/2012 | Davies ............ H01L 31/02168 136/259 |

(Continued)

FOREIGN PATENT DOCUMENTS

| | | |
|---|---|---|
| KR | 10-2012-0087946 A | 8/2012 |
| KR | 10-2015-0108239 A | 9/2015 |
| WO | WO2012128439 * | 9/2012 |

OTHER PUBLICATIONS

R. Machorro et al. Modification of Refractive Index in Silicon Oxynitride Films Duing Deposition, 2000, Materials Letters, 45, 47-50 (Year: 2000).*

*Primary Examiner* — Bach T Dinh
(74) *Attorney, Agent, or Firm* — Birch, Stewart, Kolasch & Birch, LLP

(57) ABSTRACT

Disclosed is a solar cell including: a semiconductor substrate; a conductive region on or at the semiconductor substrate; an electrode electrically connected to the conductive region; and a passivation layer on a light incident surface of the semiconductor substrate. The passivation layer includes a first layer in contact with the light incident surface of the semiconductor substrate and formed of silicon oxynitride for ultraviolet stability. The first layer includes a plurality of phases of the silicon oxynitride, and the plurality of phases are formed of the silicon oxynitride having different compositions.

19 Claims, 5 Drawing Sheets

(56) References Cited

U.S. PATENT DOCUMENTS

| | | | |
|---|---|---|---|
| 2015/0255646 A1* | 9/2015 | Chan | H01L 31/022441 |
| | | | 136/256 |
| 2015/0263193 A1* | 9/2015 | Chung | H01L 31/022433 |
| | | | 136/256 |
| 2016/0276519 A1* | 9/2016 | Zhu | H01L 31/02167 |

* cited by examiner (a)

(b)

SOLAR CELL

CROSS-REFERENCE TO RELATED APPLICATION

This application claims priority benefit of Korean Patent Application No. 10-2017-0006173, filed in the Korean Intellectual Property Office on Jan. 13, 2017, the entire contents of which are incorporated herein by reference.

BACKGROUND OF THE INVENTION

Field of the Invention

Embodiments of the invention relate to a solar cell, and, more particularly, to a solar cell having an improved structure.

Description of the Related Art

Recently, as existing energy resources such as petroleum and coal are expected to be depleted, interest in alternative energy to replace them is increasing. Among them, solar cells are attracting attention as a next-generation battery that converts solar energy into electric energy.

In such solar cells, various layers and electrodes may be fabricated according to a design. Efficiency of solar cell may be determined by the design of these various layers and electrodes. In order to commercialize solar cells, it is required to overcome low efficiency, and various layers and electrodes are required to be designed and manufactured so as to maximize the efficiency of the solar cell.

SUMMARY OF THE INVENTION

Therefore, embodiments of the invention have been made in view of the above problems, and embodiments of the invention are to provide a solar cell having excellent efficiency A solar cell according to an embodiment of the invention includes: a semiconductor substrate; a conductive region on or at the semiconductor substrate; an electrode electrically connected to the conductive region; and a passivation layer on a light incident surface of the semiconductor substrate. The passivation layer includes a first layer in contact with the light incident surface of the semiconductor substrate and formed of silicon oxynitride for ultraviolet stability. The first layer includes a plurality of phases of the silicon oxynitride, and the plurality of phases are formed of the silicon oxynitride having different compositions.

According to embodiments of the invention, a first layer of a passivation layer being in contact with a light incident surface of a semiconductor substrate includes silicon oxynitride, and can serve both as a passivation layer and as a layer for improving ultraviolet stability. Accordingly, a passivation property and ultraviolet stability can be improved simultaneously by a simple structure. Further, the passivation layer includes a second layer and a third layer together with the first layer, and thus, an anti-reflection effect and a capping effect can be enhanced and ultraviolet stability can be enhanced more. In this instance, the first layer, the second layer, and the third layer are formed of different materials including silicon and nitrogen, and thus, the passivation layer having a plurality of layers can be formed by a simple process.

DETAILED DESCRIPTION OF THE EMBODIMENTS

Figure 1:
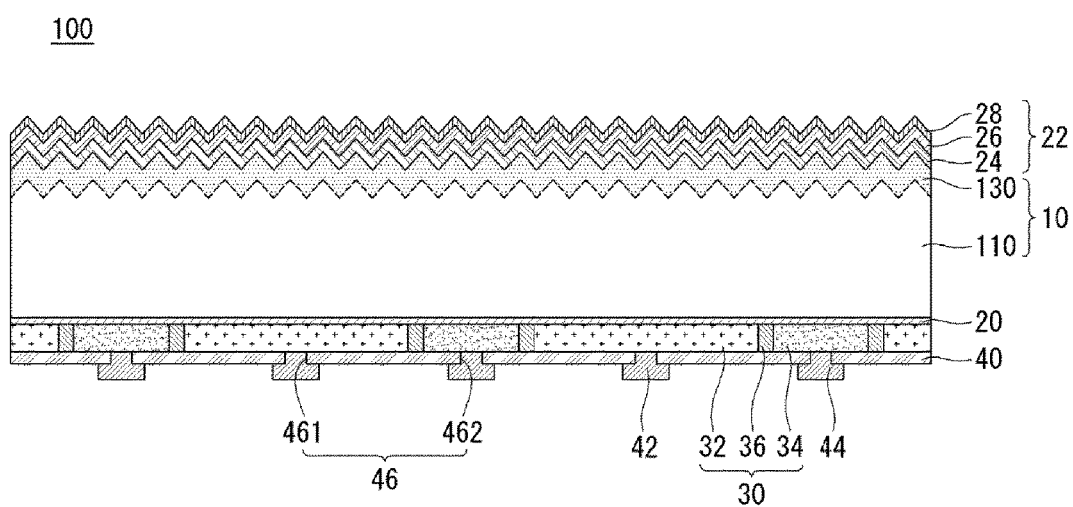
FIG. 1 is a cross-sectional view showing a solar cell according to an embodiment of the invention.

Hereinafter, embodiments of the invention will be described in detail with reference to accompanying drawings. However, embodiments of the invention are not limited thereto, and may be modified to other various embodiments.

In the drawings, illustration of portions unrelated to descriptions is omitted for clarity and simplicity. The same reference numerals designate the same or very similar elements throughout the specification. In the drawings, thicknesses, widths or the like of elements are exaggerated or reduced for clarity of descriptions, and thus, embodiments of the invention are not limited to the thickness, widths, or the like.

It will be understood that terms "comprise" and/or "comprising," or "include" and/or "including" used in the specification do not preclude a presence or addition of one or more other elements. In addition, it will be understood that, when an element such as a layer, film, region, or plate is referred to as being "on" another element, it may be disposed "directly on" another element or may be disposed such that an intervening element is also present therebetween. Accordingly, when an element such as a layer, film, region, or plate is disposed "directly on" another element, this means that there is no intervening element between the elements.

Hereinafter, a solar cell according to an embodiment of the invention will be described in detail with reference to the accompanying drawings.

Figure 2:
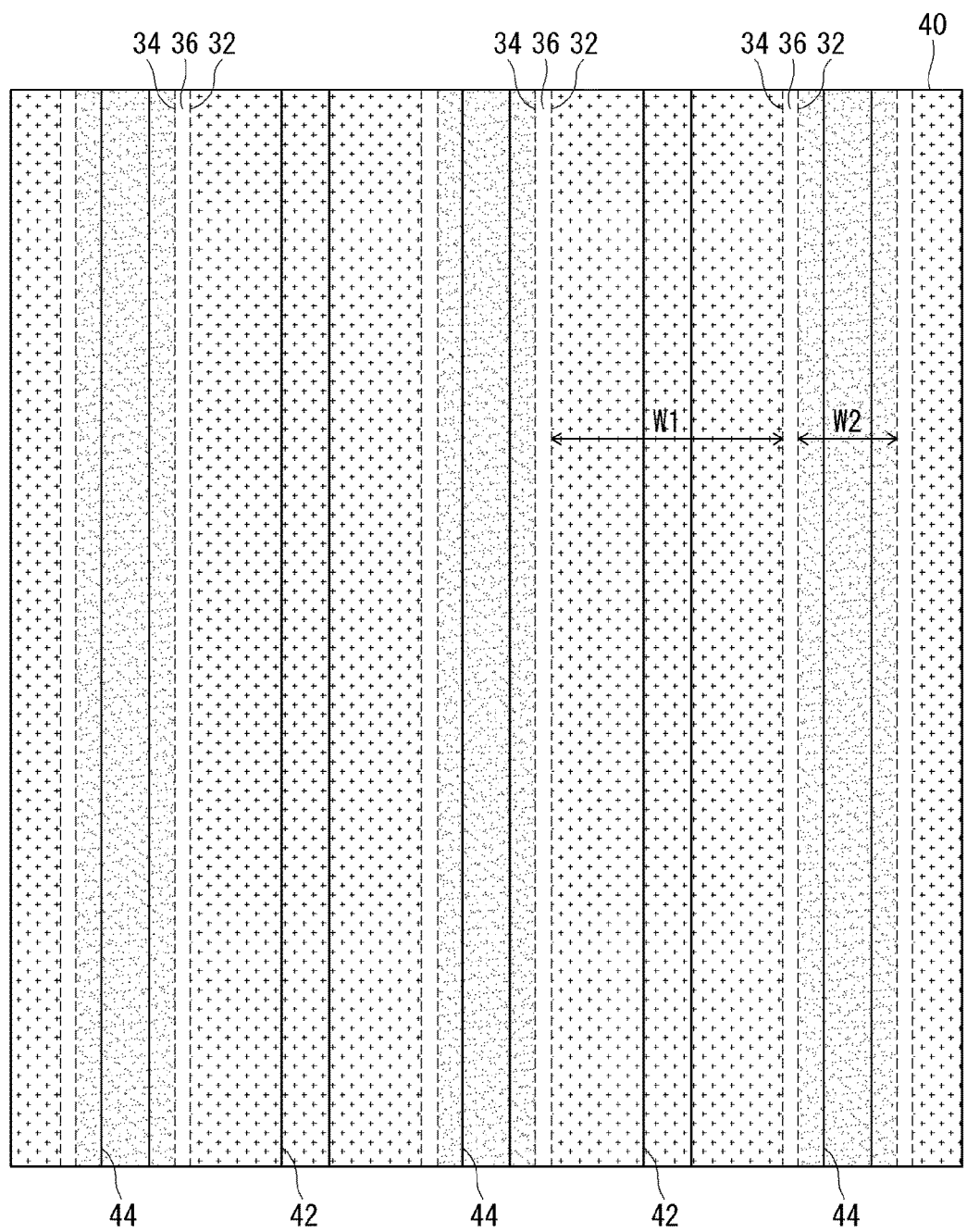
FIG. 2 is a partial rear plan view of the solar cell shown in FIG. 1.

FIG. 1 is a cross-sectional view showing a solar cell according to an embodiment of the invention, and FIG. 2 is a partial rear plan view of the solar cell shown in FIG. 1.

Referring to FIGS. 1 and 2, a solar cell 100 according to an embodiment of the invention includes a semiconductor substrate 10, conductive regions 32 and 34 formed on the semiconductor substrate 10, electrodes 42 and 44 electrically connected to the conductive regions 32 and 34, and a first passivation layer 22 formed on a light incident surface of the semiconductor substrate 10. In this instance, the first passivation layer 22 includes a first layer 24 being in contact with the light incident surface of the semiconductor substrate 10 and including or formed of silicon oxynitride to have ultraviolet stability. The conductive regions 32 and 34 include a first conductive region 32 having a first conductivity type and a second conductive region 34 having a second conductivity type. The electrodes 42 and 44 may include first electrodes 42 electrically connected to the first conductive regions 32 and second electrodes 44 electrically connected to the second conductive regions 34. In addition, the solar cell 100 may further include a control passivation layer 20 and a second passivation layer 40, or so on. This will be described in more detail.

The semiconductor substrate 10 may include a base region 110 including a second conductivity type dopant to have a second conductivity type at a relatively low doping concentration. The base region 110 may be formed of a crystalline semiconductor (e.g., a single-crystalline or a poly-crystalline semiconductor, e.g., single-crystalline or poly-crystalline silicon, particularly, single-crystalline silicon) including a second conductivity type dopant. The solar cell 100 based on the semiconductor substrate 10 or the base region 110 having a high degree of crystallinity and having few defects is excellent in electrical properties.

The second conductivity type may be a p-type or an n-type. For example, when the base region 110 is an n-type, a life time of electrons, which are majority carriers, can be increased. Also, the first conductive region 32 of a p-type that forms a junction (for example, a pn junction while interposing the control passivation layer 20), which generates carriers by a photoelectric conversion, with the base region 110 can be formed with a large area, and thus, a photoelectric conversion area can be increased. Also, the first conductive region 32 having a large area can effectively collect holes having a relatively slow moving speed, thereby contributing to an improvement of the photoelectric conversion efficiency. However, embodiments of the invention are not limited thereto.

An anti-reflection structure for minimizing a reflection may be formed at at least one of a front surface and a back surface of the semiconductor substrate 10. In the embodiment, the anti-reflection structure may be formed at the front surface of the semiconductor substrate 10, which is a light incident surface where the light is incident. For example, a texturing structure having a concave/convex shape or unevenness in a form of a pyramid or the like may be provided as an anti-reflection structure. The texturing structure formed at the semiconductor substrate 10 may have a certain shape (e.g., a pyramid shape) having an outer surface formed along a specific crystal plane (e.g., (111) plane) of a semiconductor. When a surface roughness of the semiconductor substrate 10 is increased by the concave/convex structure on the front surface of the semiconductor substrate 10 formed by the texturing, a reflectance of light incident through the front surface of the semiconductor substrate 10 can be reduced to minimize an optical loss.

The back surface of the semiconductor substrate 10 may be formed of a relatively smooth and flat surface having a surface roughness smaller than that of the front surface by a mirror-polishing or the like. When the first and second conductive regions 32 and 34 are formed together on the back surface of the semiconductor substrate 10 as in the embodiment, properties of the solar cell 100 may be greatly varied according to properties of the back surface of the semiconductor substrate 10. As a result, the unevenness due to the texturing is not formed at the back surface of the semiconductor substrate 10, and thus, a passivation property of at the back surface of the semiconductor substrate 10 can be improved, thereby improving the properties of the solar cell 100. However, the unevenness due to the texturing may be formed at the back surface of the semiconductor substrate 10 in some embodiments. Various other variations are possible.

In this instance, a surface filed region (for example, a front surface field region 130) may be positioned on or at the front surface of the semiconductor substrate 10 where the first and second conductive regions 32 and 34 and the first and second electrodes 42 and 44 are not formed. The front surface field region 130 may be formed of a doped region having a second conductivity type the same as the base area 110 and doping with a doping concentration higher than that of the base area 110. The doped region may constitute a part of the semiconductor substrate 10. The front surface field region 130 may be formed by doping a portion of the front surface of the semiconductor substrate 10 by any of various methods, such as, an ion implantation method, a thermal diffusion method, a laser doping method, or the like.

The control passivation layer 20 may be formed on the back surface of the semiconductor substrate 10. For example, the control passivation layer 20 may be entirely formed on the back surface of the semiconductor substrate 10 and be in contact with the back surface of the semiconductor substrate 10. Then, the control passivation layer 20 can be easily formed without a patterning, a structure thereof can be simplified, and carriers can be stably transferred.

In the embodiment, the control passivation layer 20 positioned between the semiconductor substrate 10 and the conductive regions 32 and 34 acts as a dopant controller or a diffusion barrier that prevents the dopants of the conductive regions 32 and 34 from being excessively diffused into the semiconductor substrate 10. The control passivation layer 20 may include any of various materials capable of controlling the dopants and capable of transporting majority carriers. For example, the control passivation layer 20 may include an oxide, a nitride, a semiconductor, a conductive polymer, or the like. For example, the control passivation layer 20 may be an oxide layer, and, more particular, a silicon oxide layer including a silicon oxide. The silicon oxide layer has an excellent passivation property and carriers are smoothly transferred through the silicon oxide layer.

The control passivation layer 20 may have a small thickness so that carriers can be stably transferred. For example, a thickness of the control passivation layer 20 may be 5 nm or less (more specifically, 2 nm or less, for example, 0.5 nm to 2 nm). If the thickness of the control passivation layer 20 is more than 5 nm, the carriers may be not transferred and the solar cell 100 may not operate. If the thickness of the control passivation layer 20 is less than 0.5 nm, the control passivation layer 20 having a desired quality may be difficult to be formed. The thickness of the control passivation layer 20 may be 2 nm or less (more specifically, 0.5 nm to 2 nm) so that the carriers can be smoothly transferred more. In this instance, the thickness of the control passivation layer 20 may be 0.5 nm to 1.5 nm so that carriers can be stably transferred more. However, embodiments of the invention are not limited thereto, and the thickness of the control passivation layer 20 may have any of various values.

A semiconductor layer 30 including the conductive regions 32 and 34 may be positioned on the control passivation layer 20. In one example, the semiconductor layer 30 may be in contact with the control passivation layer 20 to simplify a structure and allow carriers to be easily transferred.

In the embodiment, the semiconductor layer 30 includes the first conductive region 32 having a first conductivity type dopant to have a first conductivity type, and the second conductive region 34 having a second conductivity type dopant to have a second conductivity type. The first conductive region 32 and the second conductive region 34 may be positioned together at or in the semiconductor layer 30 continuously formed on the control passivation layer 20, and thus, may be coplanar or positioned on the same plane. A barrier region 36 may be positioned between the first conductive region 32 and the second conductive region 34.

The first conductive region 32 may constitute an emitter region forming a pn junction (or a pn tunnel junction) with the base region 110, which interposes the control passivation layer 20 between the first conductive region 32 and the base region 110, to generate carriers by a photoelectric conversion. The second conductive region 34 may constitute a back surface field region for generating a back surface field to prevent carriers from being lost due to a recombination at the back surface of the semiconductor substrate 10.

In this instance, the first conductive region 32 may include a semiconductor (for example, silicon) including a first conductivity type dopant to have a conductivity type opposite to that of the base region 110. The second conductive region 34 may include a semiconductor (for example, silicon) having a second conductivity type dopant to have a conductivity type the same as that of the base region 110, and a doping concentration of the second conductive region 34 may be higher than that of the base region 110. In the embodiment, the first and second conductive regions 32 and 34 may be formed of a semiconductor layer, which is formed on the semiconductor substrate 10 (more specifically, on the control passivation layer 20) to be separated from the semiconductor substrate 10 and is doped with the first or second conductivity type dopant. Accordingly, the first and second conductive regions 32 and 34 may be formed of a semiconductor layer having a crystal structure different from that of the semiconductor substrate 10 so that the first and second conductive regions 32 and 34 can be easily formed on the semiconductor substrate 10. For example, the first and second conductive regions 32 and 34 may be formed by doping an amorphous semiconductor, a micro-crystalline semiconductor, or a poly-crystalline semiconductor (e.g., amorphous silicon, micro-crystalline silicon, or poly-crystalline silicon) or the like, which can be easily manufactured by any of various methods, such as, a deposition, with a first or second conductivity type dopant. In particular, when the first and second conductive regions 32 and 34 include a poly-crystalline semiconductor, a carrier mobility can be high. The first or second conductivity type dopant may be doped during a process of forming the semiconductor layer 30 to be included in the semiconductor layer 30 or may be doped by any of various doping methods, such as, a thermal diffusion method, an ion implantation method, or the like, after forming the semiconductor layer 30.

Any of various materials, which may be doped to the semiconductor layer 30 to exhibit an n-type or a p-type, may be used for the first or second conductivity type dopant. When the first or second conductivity type dopant is a p-type, a group III element, such as, boron (B), aluminum (Al), gallium (Ga), indium (In) or so on, may be used. When the first or second conductivity type dopant is an n-type, a group V element, such as, phosphorus (P), arsenic (As), bismuth (Bi), antimony (Sb) or so on, may be used. In one example, one of the first and second conductivity type dopants may be boron (B) and the other of the first and second conductivity type dopants may be phosphorus (P).

The barrier region 36 may be positioned between the first conductive region 32 and the second conductive region 34 to separate the first conductive region 32 and the second conductive region 34 each other. If the first conductive region 32 and the second conductive region 34 are in contact with each other, a shunt may occur, thereby deteriorating a performance of the solar cell 100. Accordingly, in the embodiment, an unnecessary shunt can be prevented by positioning the barrier region 36 between the first conductive region 32 and the second conductive region 34.

An insulating material, which is not doped, (i.e., an undoped insulating material) (e.g., an oxide, a nitride) or so on may be used for the barrier region 36. Alternatively, the barrier region 36 may include an intrinsic semiconductor. In this instance, the first conductive region 32, the second conductive region 34, and the barrier region 36 are formed of the same semiconductor layer (for example, an amorphous silicon layer, a micro-crystalline silicon layer, a poly-crystalline silicon layer), which is continuously formed so that side surfaces of them are in contact with each other. The barrier region 36 may be formed of an i-type (intrinsic) semiconductor material that substantially does not include dopants. For example, a semiconductor layer including a semiconductor material may be formed, and then, a first conductivity type dopant may be doped to a portion of the semiconductor layer to form a first conductive region 32 and a second conductivity type dopant may be doped another portion of the semiconductor layer. Then, a region where the first conductive region 32 and the second conductive region 34 are not formed may constitute the barrier region 36. In this instance, a manufacturing method for the first conductive region 32, the second conductive region 34, and the barrier region 36 can be simplified.

However, embodiments of the invention are not limited thereto. Accordingly, the barrier region 36 may be formed by any of various methods and may have any of various thicknesses and any of various shapes. The barrier region 36 may be a trench of an empty space. Various other variations are possible. In the drawing, it is exemplified that the barrier region 36 entirely separates the first conductive region 32 and the second conductive region 34. However, the barrier region 36 may be formed to separate only a part of a boundary portion of the first conductive region 32 and the second conductive region 34. Alternatively, since the barrier region 36 is not formed, and a boundary of the first conductive region 32 and the second conductive region 34 may be in contact with each other.

The second passivation layer 40 may be formed on the first and second conductive regions 32 and 34 and the barrier region 36 at the back surface of the semiconductor substrate 10. For example, the second passivation layer 40 may be in contact with the first and second conductive regions 32 and 34 and the barrier region 36 to simplify a structure of the solar cell 100.

The second passivation layer 40 has contact holes 46 for electrically connecting the conductive regions 32 and 34 to the electrodes 42 and 42. The contact hole 46 includes first contact holes 461 for connecting the first conductive region 32 and the first electrode 42 and second contact holes 462 for connecting the second conductive region 34 and the second electrode 44. The second passivation layer 40 may passivate the first and second conductive regions 32 and 34 and/or the barrier region 36.

The second passivation layer 40 may be formed of any of various materials. For example, the passivation layer 40 may be formed of a single layer or have a multilayer structure having at least two layers, which includes at least one selected from a group consisting of a silicon nitride layer, a silicon nitride layer including hydrogen, a silicon oxide layer, silicon oxynitride layer, an aluminum oxide layer, a silicon carbide layer, $MgF_2$, $ZnS$, $TiO_2$, and $CeO_2$.

In the embodiment, the first passivation layer 22 may be formed on the front surface of the semiconductor substrate 10 (more particularly, on the front surface field region 130 formed at the front surface of the semiconductor substrate 10) to be in contact with the same. As described above, in the embodiment, the front surface of the semiconductor substrate 10 constitutes a light incident surface through which light is incident. Thus, the first passivation layer 22 formed on the light incident surface is positioned on the front surface of the semiconductor substrate 10. However, embodiments of the invention are not limited thereto. Therefore, when the back surface of the semiconductor substrate 10 constitutes a light incident surface, the first passivation layer 22 may be positioned on the back surface of the semiconductor substrate 10. Such an example will be described in more detail later with reference to FIG. 6.

As described above, in the embodiment, the first passivation layer 22 includes the first layer 24 being in contact with the light incident surface and including silicon oxynitride. Accordingly, the first layer 24 is formed to be in contact with the front surface of the semiconductor substrate 10 or the front surface field region 130 having the anti-reflection structure.

In this instance, the silicon oxynitride of the first layer 24 may be silicon oxynitride containing hydrogen (or hydrogenated silicon oxynitride). Since the silicon oxynitride can include hydrogen, a surface passivation property of the semiconductor substrate 10 can be enhanced by a hydrogen passivation which provides hydrogen to the surface of the semiconductor substrate 10. In addition, in the embodiment, the first layer 24 including silicon oxynitride also absorbs, blocks, or filters ultraviolet light that may not greatly contribute to a photoelectric conversion and may deteriorate the stability of the solar cell 100. Thus, the first layer 24 can act both as a passivation layer and as a layer for improving ultraviolet stability. Accordingly, the passivation property and the ultraviolet stability can be improved simultaneously by a simple structure.

That is, in the embodiment, even if ultraviolet light is continuously incident on the light incident surface, a phenomenon that a property (for example, an open-circuit voltage) of the solar cell 100 is deteriorated or lowered does not occur by the first layer 24 formed of the silicon oxynitride. Accordingly, the solar cell 100 can have excellent ultraviolet stability by a simple structure. On the other hand, in the conventional solar cell, when light is continuously incident on the light incident surface, a property (for example, an open-circuit voltage) of the solar cell may be deteriorated or lowered. Accordingly, the conventional solar cell does not have excellent ultraviolet stability. The problem described above may be more serious in a solar cell panel including the solar cell 100 because a portion of the solar cell adjacent to the light incident surface (in particular, a sealing material adjacent to the light incident surface) does not include an ultraviolet (UV) stabilizer in consideration with stability problems. For example, if the sealing material includes an ultraviolet stabilizer, a passage through which current can flow may generate due to metal ions contained in the ultraviolet stabilizer. Accordingly, a frame and a solar cell to be insulated from each other may be conducted or electrically connected, and thus, a potential induced degradation (PID) phenomenon may occur.

As an example, in the embodiment, the first layer 24 may include nitrogen in an amount of 1 to 20 at % (e.g., 5 to 20 at %). If the nitrogen is includes less than 1 at %, an effect of improving ultraviolet stability may not be sufficient. That is, the above range is determined so that the first layer 24 can effectively improve a passivation property and ultraviolet stability at the same time, but embodiments of the invention are not limited thereto. An oxygen content (at %) of the first layer 24 may be greater than a nitrogen content (at %) of the first layer 24 based on an atomic content (at %). It is assumed that a bonding property between oxygen and silicon may be better than a bonding property between nitrogen and silicon.

For reference, although a silicon oxide layer, a silicon nitride layer, and an amorphous silicon layer may include hydrogen, they cannot absorb, block, or filter ultraviolet light, and thus, an improvement of ultraviolet stability is difficult to be achieved by the same. Furthermore, when the silicon nitride layer is formed to be in contact with the semiconductor substrate 10, a dangling bond or the like may remain after the bonding of silicon and nitrogen, thereby deteriorating the passivation property. The amorphous silicon is also difficult to effectively improve the passivation property. Silicon carbonitride is difficult to include hydrogen because the carbon is positioned at the site where hydrogen is to be placed, and thus, it is difficult to improve the hydrogen passivation property. Other layers also have difficulty in improving the hydrogen passivation property and the ultraviolet stability at the same time.

In this instance, the first layer 24 may include a plurality of multi-phases 241 and 242 which are formed of silicon oxynitride, but has different compositions, in order to improve ultraviolet stability. More particularly, at least one of nitrogen contents and/or carbon contents of the plurality of phases 241 and 242 may be different from each other. For example, each of the plurality of phases 241 and 242 may include nitrogen in an amount of 1 to 20 at % (e.g., 5 to 20 at %).

More particularly, each of the plurality of phases 241 and 242 has chemical formula of $Si_{1-y}(O_xN_{1-x})_y$, where x and y are greater than 0 and less than 1. In this instance, the x values of the plurality of phases 241 and 242 may be different from each other. Here, the y values of the plurality of phases 241 and 242 may be the same or different. For example, the plurality of phases 241 and 242 may include a first phase 241 having an x value of a predetermined level or more (an average value or more) and a second phase 242 having an x value of a predetermined level or less (for example, an average value or less). According to this, an oxygen content of the first phase 241 is higher than an oxygen content of the second phase 242, and a nitrogen content of the first phase 241 is lower than a nitrogen content of the second phase 242. A plurality of first phases 241 and/or a plurality of second phases 242 may be provided. In this instance, the x values, the oxygen contents, and the nitrogen contents of the plurality of first phases 241 may be the same as or different from each other, and the x values, the oxygen contents, and the nitrogen contents of the plurality of second phases 242 may be the same or different from each other.

Figure 3:
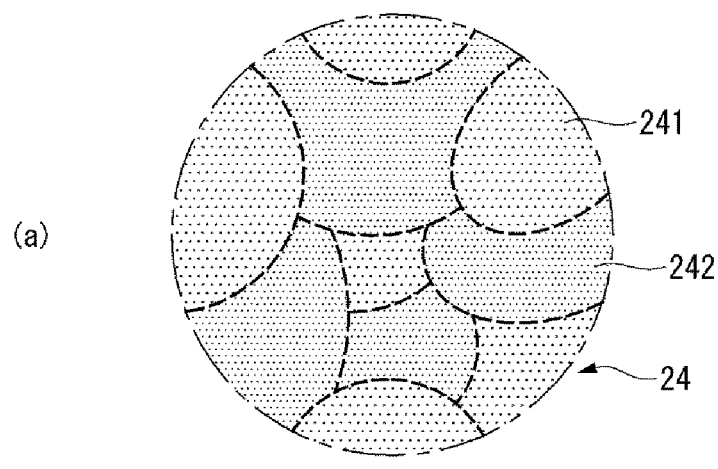
FIG. 3 is enlarged views showing an example of a plurality of phases included in a first layer of a first passivation layer of the solar cell shown in FIG. 1.
Figure 3:
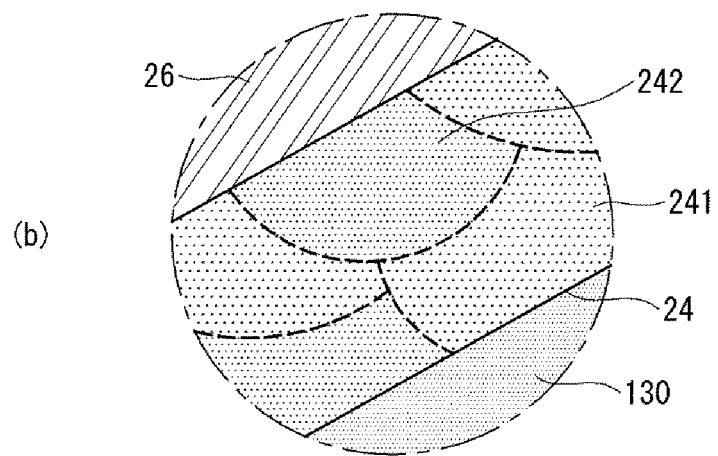
Figure 4:
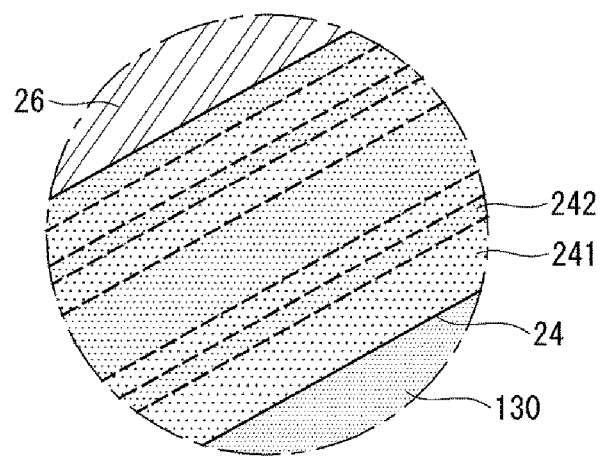
FIG. 4 is an enlarged view showing another example of a plurality of phases included in a first layer of a first passivation layer of the solar cell shown in FIG. 1.

A shape, a position, or so on of the plurality of phases 241 and 242 may be variously modified. This will be described in detail with reference to FIGS. 3 and 4 showing various examples of the plurality of phases 241 and 242 of the first layer 24 in the embodiment. For reference, (a) of FIG. 3 is an enlarged plan view of the first layer 24, (b) of FIG. 3 is an enlarged cross-sectional view of the first layer 24, and FIG. 4 is an enlarged cross-sectional view of the first layer 24.

As shown in (a) and (b) of FIG. 3, each of a plurality of phases 241 and 242 has a dot shape. The plurality of phases 241 and 242 may be positioned in a thickness direction of the first layer 24 and may be positioned on a plane of the first layer 24. For example, it is exemplified that a plurality of first phases 241 having relatively high x values and a plurality of second phases 242 having relatively low x values are arranged in a dot shape in FIG. 3. In this instance, as described above, the x values of the plurality of first phases 241 may be the same or different from each other, and the x values of the plurality of second phases 242 may be the same or different from each other. Alternatively, as shown in FIG. 4, each of a plurality of phases 241 and 242 has a layered shape, and the plurality of phases 241 and 242 of a plurality of layers are sequentially stacked in a thickness direction of the first layer 24. For example, it is exemplified that a plurality of first phases 241 having relatively high x values and a plurality of second phases 242 having relatively low x values are alternately disposed to form a multi-layered structure in FIG. 4. In this instance, as described above, the x values of the plurality of first phases 241 may be the same or different from each other, and the x values of the plurality of second phases 242 may be the same or different from each other. As one example, the first phase 241 having the relatively high x value and having the relatively high oxygen content is in contact with the semiconductor substrate 10, and thus, the passivation property can be enhanced more. However, embodiments of the invention are not limited thereto, and the second phase 242 having the relatively low x value may be formed to be in contact with the semiconductor substrate 10.

Figure 5:
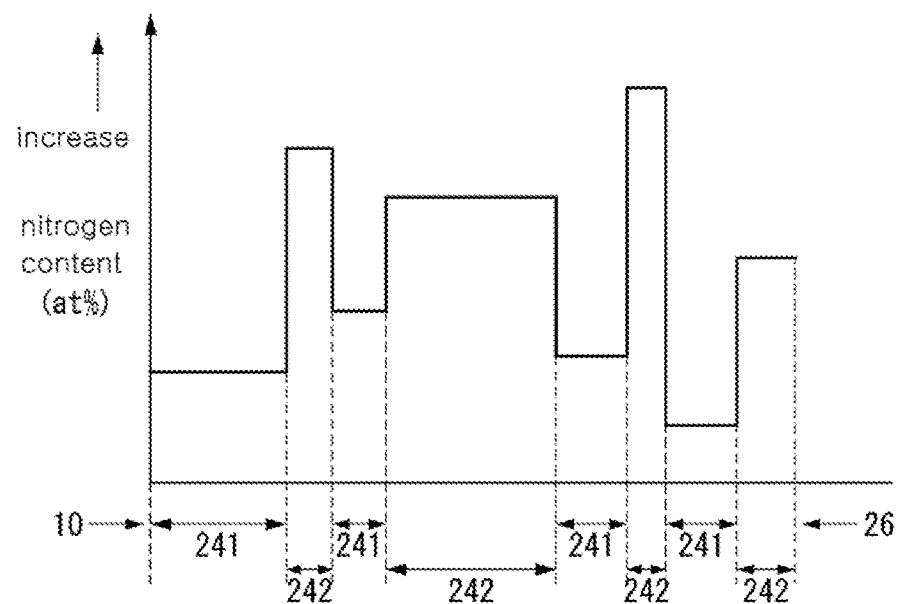
FIG. 5 is a graph schematically showing a nitrogen content of the first layer of the first passivation layer of the solar cell shown in FIG. 1.

The first phase 241 and the second phase 242 of the first layer 24 will be described in more detail with reference to FIG. 5. FIG. 5 is a graph schematically showing a nitrogen content [at %] of the first layer of the first passivation layer of the solar cell shown in FIG. 5. For example, FIG. 5 may show a nitrogen content in a thickness direction of the first layer 24 according to the example shown in FIG. 4.

Referring to FIG. 5, in a first layer 24 of silicon oxynitride according to the embodiment, a plurality of first phases 241 having relatively high oxygen contents and relatively low nitrogen contents, and a plurality of second phases 242 having relatively low oxygen contents and relatively high nitrogen contents are repeatedly positioned. Thus, it can be seen that the first layer 24 formed of silicon oxynitride has a plurality of phases 241 and 242 having different compositions. In this instance, it is exemplified that the oxygen contents and the nitrogen contents of the plurality of first phases 241 are different from each other, the oxygen contents and the nitrogen contents of the plurality of second phases 242 are different from each other, and lots of the plurality of phases 241 and 242 having different nitrogen and oxygen contents are positioned.

The plurality of phases 241 and 242 having different compositions according to different x values may have layer densities different from each other. Accordingly, the first layer 24 has a relatively large variation or deviation in a layer density, and thus, the first layer 24 has a difference in brightness when viewed by a transmission electron microscope (TEM). That is, when the first layer 24 including the plurality of phases 241 and 242 is observed by a transmission electron microscope, it can be seen that a plurality of portions having different brightness are positioned. From this, it is determined that the first layer 24 includes the plurality of phases 241 and 242. Whether or not the first layer 24 has the plurality of phases 241 and 242 may be checked by various other methods.

The first layer 24 including the plurality of phases 241 and 242 may be formed by any of various methods. For example, when the first layer 24 is formed by a deposition process, the first layer 24 including the plurality of phases 241 and 242 having different compositions may be formed by varying amounts, supply times, or so on of raw gases (particularly, a raw gas including oxygen, a raw gas including nitrogen). For the deposition process, a chemical vapor deposition (CVD) method, a plasma-induced chemical vapor deposition (PECVD) method, or the like may be used. Alternatively, the first layer 24 including the plurality of phases 241 and 242 having different compositions may be formed by repeating a formation process of the plurality of phases 241 and 242 having a desired composition using an epitaxial growth method.

Meanwhile, referring to FIG. 1 again, the first passivation layer 22 may further include at least one layer 26 and 28 on the first layer 24 and may be formed of a plurality of layers 24, 26, and 28. In this instance, the at least one layer 26 and 28 positioned on the first layer 24 may include silicon and nitrogen as a common material, but may be formed of a material different from the first layer 24. Then, the at least one of the layers 26 and 28 positioned on the first layer 24 includes silicon and nitrogen, as the first layer 24, and thus, the at least one layer 26 and 28 can easily be formed by changing process conditions. In one example, the at least one layer 26 and 28 positioned on the first layer 24 may be formed by an in-situ process. That is, the first layer 24 and the at least one layer 26 and 28 may be formed by a continuous process using the same process in the same apparatus. For example, the first layer 24 is formed by a deposition method through providing a silicon-including gas, a nitrogen-including gas, and an oxygen-containing gas as raw gases, and then, the at least one layer 26 and 28 is continuously formed by the deposition method through changing a kind of raw gases. According to this, stability can be improved and a manufacturing process can be simplified by the common material as compared with the case that the at least one layer 26 and 28 and the first layer 24 do not include the common material.

In one example, the first passivation layer 22 may include a second layer 26 formed on the first layer 24 and formed of silicon nitride, and a third layer 26 formed on the second layer 26 and formed of silicon carbonitride. In this instance, the second layer 26 may be in contact with the first layer 24 and the third layer 28 may be in contact with the second layer 26 so that the first passivation layer 22 has a three-layered structure. Then, the first passivation layer 22 may have a simple structure while satisfying various properties. However, embodiments of the invention are not limited thereto.

The second layer 26 may include silicon nitride to reduce a reflectance of light incident on the light incident surface, thereby increasing an amount of light reaching the pn junction. Accordingly, short circuit current Isc of the solar cell 100 can be increased. The third layer 28 may include silicon carbonitride and thus may have excellent resistance to an etchant solution or the like. Thus, the third layer 28 can prevent damage of the first layer 24 and the second layer 26 or change in properties of the first layer 24 and the second layer 26 in an etching process or the like. In addition, the ultraviolet stability can be further improved by the stacked structure of the first layer 24, the second layer 26, and the third layer 28. As an example, the second layer 26 may have chemical formula of $Si_zN_{1-z}$, where z is greater than 0 and less than 1, and the third layer 28 may have chemical formula of $Si_b(C_aN_{1-a})_{1-b}$, where a and b are greater than 0 and less than 1. A carbon content (at %) of the third layer 28 may be greater than a nitrogen content (at %) of the third layer 28, based on an atomic content (at %). According to this, the third layer 28 can have better properties to the etching solution.

In this instance, the plurality of layers 24, 26, and 28 of the first passivation layer 22 may be arranged so that an extinction coefficient of the first passivation layer 22 increases as it goes away from the semiconductor substrate 10. That is, the extinction coefficient of the second layer 26 is greater than the extinction coefficient of the first layer 24, and the extinction coefficient of the third layer 28 is the same as or greater than the extinction coefficient of the second layer 26. The plurality of layers 24, 26, and 28 of the first passivation layer 22 may be arranged so that a refractive index of the first passivation layer 22 increases as it goes away from the semiconductor substrate 10. That is, the refractive index of the second layer 26 is greater than the refractive index of the first layer 24, and the refractive index of the third layer 28 is the same as or greater than the refractive index of the second layer 26. As a result, ultraviolet stability by the first passivation layer 22 can be further improved.

Unlike the first layer 24, the second layer 26 and/or the third layer 28 does not have a plurality of phases and may be formed of a single phase. The second layer 26 and/or the third layer 28 may have a variation or a deviation of a layer density that is less than that of the first layer 24. In one example, the variation or the deviation of the layer density may be a standard deviation of a layer density. The standard deviation may be measured by any of various methods, such as, an x-ray diffraction (XRD) method, or the like. Alternatively, when the difference in brightness is great when viewed by a transmission electron microscope, it can be seen that the standard deviation of the layer density is great.

For example, a thickness of the third layer 28 may be the same as or less than a thickness of the first layer 24 and/or the second layer 26. More particularly, the thickness of the third layer 28 may be less than the thickness of the first layer 24 and/or the second layer 26. It is sufficient that the third layer 28 is formed to have a small thickness being able to protect the first layer 24 and the second layer 26. In addition, since the third layer 28 has the greatest extinction coefficient, the third layer 28 may have a relatively small thickness so that light other than ultraviolet light can be prevented from being absorbed or blocked. The first layer 24 may be relatively thick to enhance a passivation property and ultraviolet stability together and the second layer 26 may be relatively thick to provide an excellent anti-reflection effect.

As an example, the first layer 24 or the second layer 26 may have a thickness of 10 to 100 nm, and the third layer 28 may have a thickness of 5 to 20 nm. Within the above range, effects by the first layer 24, the second layer 26, and the third layer 28 can be sufficiently achieved and the light other than ultraviolet light can be prevented from being absorbed, blocked, or so on. A total thickness of the first passivation layer 22 may be 220 nm or less (for example, 200 nm or less). The light other than ultraviolet light can be prevented from being absorbed, blocked, or so on within the thickness range.

In this instance, in the solar cell 100 having a back contact structure in which the electrodes 42 and 44 are positioned on the back surface, the first passivation layer 22 (more particularly, at least one of layers constituting the first passivation layer 22, that is, at least one of the first layer 24, the second layer 26, and the third layer 28) is in contact with the front surface field region 130 formed on or at the front surface of the semiconductor substrate 10 on which the electrodes 42 and 44 are not positioned. The first passivation layer 22 may be formed on an substantially entire portion of the front surface of the semiconductor substrate 10. Accordingly, the first passivation layer 22 can be easily manufactured without an additional patterning, and the passivation effect by the first passivation layer 22 (particularly, the first layer 24) can be maximized. Particularly, the front surface field region 130 is a doped region formed by doping a part of the semiconductor substrate 10, and the passivation property may be deteriorated by the front surface field region 130. Thus, the passivation property can be greatly improved by the first passivation layer 22 (particularly, the first layer 24). In addition, a problem caused by ultraviolet light, which may occur severely in the solar cell 100 of the back contact structure, can be effectively prevented. For reference, since the electrodes 42 and 44 are not disposed on the front surface of the semiconductor substrate 10 in the solar cell 100 having the back contact structure, the effect blocking the ultraviolet light by the electrodes 42 and 44 is not realized at the front surface of the semiconductor substrate 10. Thus, in the solar cell 100 having the back contact structure, ultraviolet stability may be relatively low, as compared with the case where the surface in which the electrodes 42 and 44 are formed is used as the light incident surface. However, embodiments of the invention are not limited thereto.

In this instance, the first passivation layer 22 and/or the second passivation layer 40 may not have a dopant or the like in order to have good insulating and passivation properties. However, embodiments of the invention are not limited thereto. Each of the front passivation layer 22 and the back passivation layer 40 may have a thickness greater than a thickness of the control passivation layer 20. Thus, effects due to the first and second passivation layers 22 and 40 can be sufficiently achieved. Various other variations are possible.

The first electrode 42 may fill at least a part of the first contact hole 461 of the second passivation layer 40 to be electrically connected to (for example, to be in contact with) the first conductive region 32. The second electrode 44 may fill at least a part of the second contact hole 462 of the second passivation layer 40 to be electrically connected to (for example, to be in contact with) the second conductive region 34.

Referring to FIG. 2, in the embodiment, the first conductive regions 32 and the second conductive regions 34 longitudinally extend to from a stripe shape, and are alternately arranged in a direction crossing a longitudinal direction thereof. The barrier region 36 may be positioned between the first conductive region 32 and the second conductive region 34 to separate them. Although not shown in the drawings, a plurality of first conductive regions 32 spaced apart from each other may be connected to each other at one edge, and a plurality of second conductive regions 34 spaced apart from each other may be connected to each other at the other edge. However, the embodiments of the invention are not limited thereto.

In this instance, an area of the first conductive region 32 may be greater than an area of the second conductive region 34. For example, areas of the first conductive region 32 and the second conductive region 34 may be adjusted by varying their widths. That is, a width W1 of the first conductive region 32 may be greater than a width W2 of the second conductive region 34.

The first electrodes 42 are formed to have a stripe shape to correspond to the first conductive regions 32 and the second electrodes 44 are formed to have a stripe shape to correspond to the second conductive regions 34. The contact holes 46 may be formed such that a part of the first and second electrodes 42 and 44 are electrically connected to (for example, are in contact with) the first and second conductive regions 32 and 34, respectively. For example, a plurality of first contact holes 461 may be formed for each of the first conductive regions 32, and a plurality of second contact holes 462 may be formed for each of the second conductive regions 34. Alternatively, each contact hole 46 may extend in an entire length to correspond to the first or second conductive region 32 or 34. Then, a contact area between the first and second electrodes 42 and 44 and the first and second conductive regions 32 and 34 can be maximized, and thus, carrier collection efficiency can be enhanced. Various other variations are possible. Although not shown in the drawings, the first electrodes 42 may be connected to each other at one edge, and the second electrodes 44 may be connected to each other at the other edge. However, the embodiments of the invention are not limited thereto.

When light is incident on the solar cell 100 according to the embodiment, electrons and holes are generated by a photoelectric conversion at the pn junction formed between the base region 110 and the first conductive region 32, and the generated holes and electrons are transferred to the first conductive region 32 and the second conductive region 34 passing through the control passivation layer 20 and then are transferred to the first and second electrodes 42 and 44, respectively, thereby generating electrical energy.

In the solar cell 100 having the back contact structure in which the electrodes 42 and 44 are formed on the back surface of the semiconductor substrate 10 and the electrodes 42 and 44 are not formed on the front surface of the semiconductor substrate 10 as in the embodiment, a shading loss at the front surface of the substrate 10 can be minimized. Thus, efficiency of the solar cell 100 can be improved. Since the control passivation layer 20 is disposed between the first and second conductive regions 32 and 34 and the semiconductor substrate 10, the first and second conductive regions 32 and 34 are formed of a separate layer different from the semiconductor substrate 10. As a result, a loss due to a recombination can be minimized as compared with a case where a doped region formed by doping the semiconductor substrate 10 with the dopants is used as the conductive region.

According to the embodiment of the invention, the first layer 24 being in contact with the semiconductor substrate 10 includes silicon oxynitride, and can serve both as a passivation layer and as a layer for improving ultraviolet stability. Accordingly, a passivation property and ultraviolet stability can be improved simultaneously by a simple structure. Further, the second layer 26 and the third layer 28 is included together with the first layer 24, and thus, an anti-reflection effect and a capping effect can be enhanced and ultraviolet stability can be enhanced more. In this instance, the first layer 24, the second layer 26, and the third layer 28 are formed of different materials including silicon and nitrogen, and thus, the first passivation layer having a plurality of layers 24, 26, and 28 can be formed by a simple process.

In the above description and drawings, it is exemplified that the first passivation layer 22 including silicon oxynitride is positioned on the surface of the semiconductor substrate 10 on which the electrodes 42 and 44 are not positioned. However, embodiments of the invention are not limited thereto. Another example will be described in detail with reference to FIG. 6.

Figure 6:
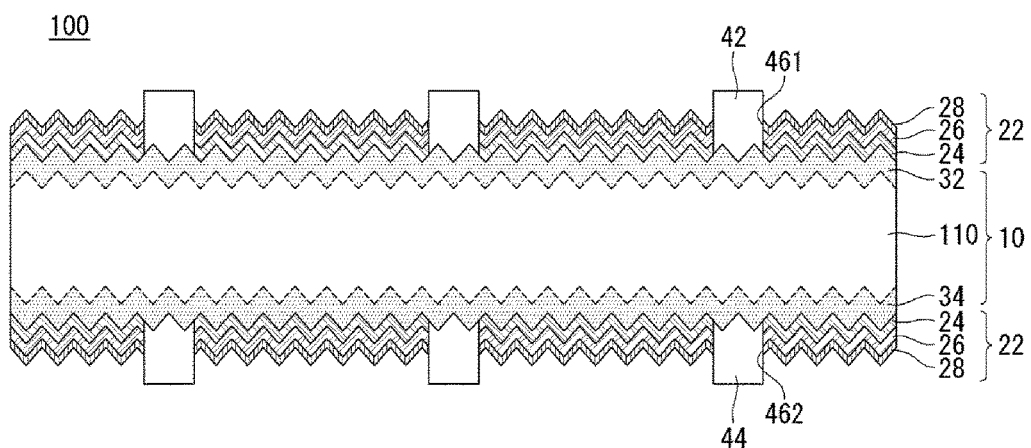
FIG. 6 is a cross-sectional view showing a solar cell according to another embodiment of the invention.

FIG. 6 is a cross-sectional view showing a solar cell according to another embodiment of the invention. Hereinafter, portions the same as or similar to the portions that are already described in the above will be omitted and portions that are different from the above will be described in detail.

Referring to FIG. 6, in the embodiment, a first conductive region 32 and a first electrode 42 are positioned on one surface (e.g., a front surface) of a semiconductor substrate 10, and a second conductive region 34 and a second electrode 44 are positioned on the other surface (e.g., a back surface) of the semiconductor substrate 10. The front surface field region 130 shown in FIG. 1 is not provided. In this instance, since each of the first electrode 42 and the second electrode 44 has a certain pattern, light can be incident on both sides of the solar cell 100. Accordingly, both of the front surface and the back surface of the semiconductor substrate 10 can be light incident surfaces.

In one example, each of the first and second conductive regions 32 and 34 may be a doped region constituting a part of the semiconductor substrate 10. Then, a first layer 24 of a first passivation layer 22 is formed on the first conductive region 32 to be in contact with the front surface of the semiconductor substrate 10 except for a portion where the first electrode 42 is positioned. In this instance, the first passivation layer 22 positioned on the front surface of the semiconductor substrate 10 may further include a second layer 26 and a third layer 28. Similarly, a first layer 24 of a first passivation layer 22 is formed on the second conductive region 33 to be in contact with the back surface of the semiconductor substrate 10 except for a portion where the second electrode 44 is positioned. In this instance, the first passivation layer 22 positioned on the back surface of the semiconductor substrate 10 may further include a second layer 26 and a third layer 28.

Although it is exemplified that the first passivation layer 22 including the first to third layers 24, 26, and 28 is formed each of the front and back surfaces of the semiconductor substrate 10, respectively. However, embodiments of the invention are not limited thereto. Therefore, the first passivation layer 22 including the first to third layers 24, 26, and 28 may be positioned on only one of the front surface and the back surface of the semiconductor substrate 10. Alternatively, stacked structures of a passivation layer positioned on the front surface of the semiconductor substrate 10 and a passivation layer on the back surface of the semiconductor substrate 10 may be different from each other.

Also, although it is exemplified that the first and second conductive regions 32 and 34 are doped regions in the drawings and the above description, embodiments of the invention are not limited thereto. Therefore, any one of the first and second conductive regions 32 and 34 may be separately formed from the semiconductor substrate 10, and this is also included in embodiments of the invention. In this instance, a control passivation layer 20 (see FIG. 1) may be disposed or may not be disposed between the semiconductor substrate 10 and the conductive regions 32 and 34 separately formed from the semiconductor substrate 10. A second passivation layer 40 (see FIG. 1) may be positioned on the conductive region 32 or 34 separately formed from the semiconductor substrate 10. Various other variations are possible.

Hereinafter, embodiments of the invention will be described in more detail with reference to experimental examples of the invention. However, the experimental examples of the invention are only for illustrating the invention, and embodiments of the invention are not limited thereto.

Embodiment 1

A control passivation layer including silicon oxide and a semiconductor layer including polycrystalline silicon were sequentially formed on a back surface of a semiconductor substrate. The semiconductor layer was doped to form first and second conductive regions, and a front surface of the semiconductor substrate was doped to form a front surface field region. A silicon oxynitride layer, a silicon nitride layer, and a silicon carbonitride layer were sequentially formed on the front surface of the semiconductor substrate using a deposition method to form a front passivation layer, and a back passivation layer was formed on the back surface of the semiconductor substrate using a deposition method. In this instance, the silicon oxynitride layer was formed to have a plurality of phases. First and second electrodes electrically connected to the first and second conductive regions are formed. Thus, a solar cell was manufactured.

Comparative Example 1

A solar cell was manufactured in the same method as in Embodiment 1, except that a front passivation layer included a silicon oxide layer formed by a thermal oxidation method and a silicon nitride layer formed by a deposition method.

Ultraviolet light is irradiated twice to the solar cells according to Embodiment 1 and Comparative Example 1. Implied open-circuit voltages (implied Vocs) in the solar cells according to Embodiment 1 and Comparative Example 1 were measured when the ultraviolet light is not irradiated, when the ultraviolet light is irradiated once, and when the ultraviolet light is irradiated twice, and the results are shown in FIG. 7.

Figure 7:
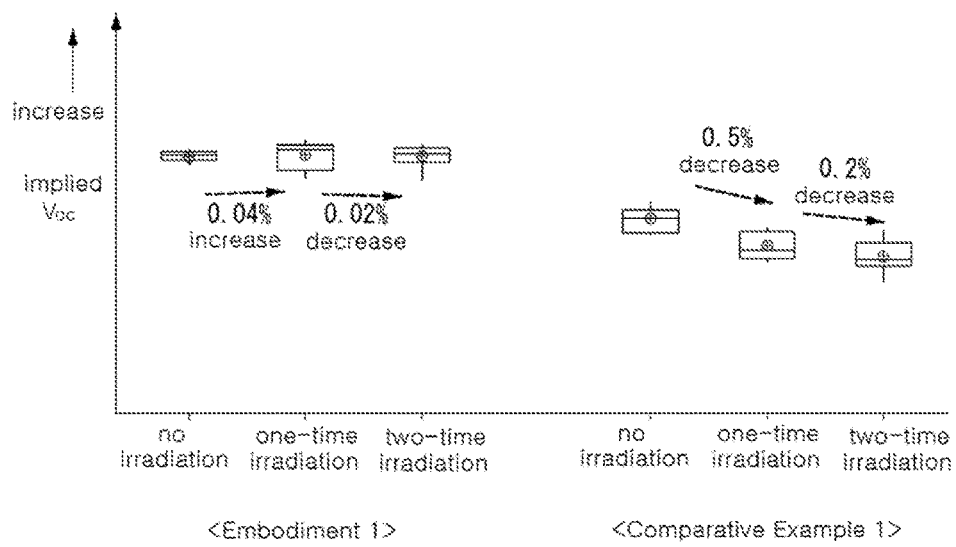
FIG. 7 is a graph showing a result of implied open-circuit voltages (implied Vocs) in solar cells according to Embodiment 1 and Comparative Example 1 when ultraviolet light is not irradiated, when the ultraviolet light is irradiated once, and when the ultraviolet light is irradiated twice.

Referring to FIG. 7, in Embodiment 1, it can be seen that a difference in the implied open-circuits when the ultraviolet light was not irradiated, when the ultraviolet light was irradiated once, the ultraviolet light was irradiated twice was small and the implied open-circuits do not have a specific tendency. Thus, it can be seen that the solar cell according to Embodiment 1 has excellent ultraviolet stability. On the other hand, in Comparative Example 1, it can be seen that the implied open-circuit greatly decreases as a number of times of ultraviolet-light irradiations increases. As a result, it can be seen that the solar cell according to Comparative Example 1 does not have excellent ultraviolet stability.

The above-described features, structures, effects, and the like are included in at least one embodiment of the invention, and are not necessarily limited to only one embodiment. Further, the features, structures, effects and the like illustrated in the embodiments may be combined and modified by persons skilled in the art to which the embodiments are pertained. Therefore, it is to be understood that embodiments of the invention are not limited to these embodiments, and various combined and modified embodiments are included in a scope of the invention.

What is claimed is:
1. A solar cell, comprising:
a semiconductor substrate;
a conductive region on or at the semiconductor substrate;
an electrode electrically connected to the conductive region; and
a passivation layer on a light incident surface of the semiconductor substrate,
wherein the passivation layer comprises a first layer in contact with the light incident surface of the semiconductor substrate and formed of silicon oxynitride for ultraviolet stability,
wherein the first layer comprises a plurality of phases of the silicon oxynitride,
wherein the plurality of phases are formed of the same material of the silicon oxynitride having different compositions,
wherein the plurality of phases comprises a plurality of first phases and a plurality of second phases,
wherein the plurality of first phases have a higher oxygen content and a lower nitrogen content than that of the plurality of the second phases, and
wherein the plurality of first phases and the plurality of second phases are alternatively positioned in a thickness direction of the first layer,
wherein the plurality of first phases are in contact with the semiconductor substrate, and
wherein the plurality of first phases have different oxygen and nitrogen content from each other, or the plurality of second phases have different oxygen and nitrogen content from each other.
2. The solar cell of claim 1, wherein the plurality of phases have a layered-structure sequentially stacked in a thickness direction of the first layer or have a dot shape.
3. The solar cell of claim 1, wherein each of the plurality of phases has chemical formula of $Si_y (O_x N_{1-x})_{1-y}$, wherein x and y are greater than 0 and less than 1, and wherein x values of the plurality of phases are different from each other.
4. The solar cell of claim 1, wherein the first layer comprises approximately 1 to 20 at % of nitrogen.
5. The solar cell of claim 1, wherein the first layer comprises hydrogenated silicon oxynitride or silicon oxynitride including hydrogen.
6. The solar cell of claim 1, wherein the passivation layer further comprises at least one layer on the first layer, and
wherein the at least one layer comprises a material including silicon and nitrogen and being different from the first layer.
7. The solar cell of claim 6, wherein the first layer and the at least one layer of the passivation layer are disposed so that an extinction coefficient of the passivation layer increases in going away from the semiconductor substrate.
8. The solar cell of claim 6, wherein the first layer and the at least one layer of the passivation layer are arranged so that a refractive index of the passivation increases in going away from the semiconductor substrate.
9. The solar cell of claim 6, wherein a layer density deviation of the first layer is greater than a layer density deviation of the at least one layer.
10. The solar cell of claim 6, wherein the passivation layer further comprises:
a second layer positioned on the first layer and formed of silicon nitride; and
a third layer positioned on the second layer and comprising silicon carbonitride.
11. The solar cell of claim 10, wherein a carbon content of the third layer is greater than a nitrogen content of the third layer, based on atomic percent.
12. The solar cell of claim 10, wherein a thickness of the third layer is the same as or less than a thickness of the first layer or the second layer.
13. The solar cell of claim 12, wherein the thickness of the first layer or the second layer is in a range of approximately 10 to 100 nm, and
wherein the thickness of the third layer is in a range of approximately 5 to 20 nm.
14. The solar cell of claim 10, wherein the second layer is in contact with the first layer and the third layer is in contact with the second layer so that the passivation layer has a three-layered structure.

15. The solar cell of claim 1, wherein the light incident surface with which the passivation layer is in contact has an anti-reflection structure.

16. The solar cell of claim 1, wherein the conductive region comprises a first conductive region having a first conductivity type and a second conductive region having a second conductive type opposite to the first conductive type,
   wherein the electrode comprises a first electrode electrically connected to the first conductive region and a second electrode electrically connected to the second conductive region, and
   wherein the first and second conductive regions and the first and second electrodes are positioned on or at a surface of the semiconductor substrate opposite to the light incident surface on which the passivation layer is positioned.

17. The solar cell of claim 16, wherein the passivation layer is formed entirely on the light incident surface of the semiconductor substrate at a location where the electrode is not positioned.

18. The solar cell of claim 16, wherein the first and second conductive regions are formed at a semiconductor layer separately positioned from the semiconductor substrate,
   wherein a front surface field region formed of a doped region is positioned on or at the light incident surface of the semiconductor substrate, and
   wherein the passivation layer is in contact with the front surface field region.

19. The solar cell of claim 18, further comprising another passivation layer on the semiconductor layer, and
   wherein the another passivation layer is formed entirely on the semiconductor layer except contact holes for connecting the first and second electrodes to the first and second conductive regions.

* * * * *